United States Patent
Jang (10) Patent No.: US 7,332,390 B2
(45) Date of Patent: Feb. 19, 2008

(54) SEMICONDUCTOR MEMORY DEVICE AND FABRICATION THEREOF

(75) Inventor: Wen-Yueh Jang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 219 days.

(21) Appl. No.: 11/288,241

(22) Filed: Nov. 29, 2005

(65) Prior Publication Data

US 2006/0263970 A1    Nov. 23, 2006

(30) Foreign Application Priority Data

May 20, 2005    (TW) ............... 94116460 A (51) Int. Cl.
*H01L 21/8234* (2006.01)
*H01L 21/8244* (2006.01)
*H01L 21/8242* (2006.01)
*H01L 21/20* (2006.01)

(52) U.S. Cl. .............. 438/238; 438/243; 438/244; 438/253; 438/386; 438/387; 438/396; 257/296; 257/297; 257/301; 257/E21.396; 257/E21.651

(58) Field of Classification Search ........ 438/238, 438/243, 244, 253, 386, 387, 396; 257/296, 257/297, 301, E21.396, E21.651
See application file for complete search history.

(56) References Cited

U.S. PATENT DOCUMENTS

| 6,784,477 | B2 * | 8/2004 | Jang | 257/301 |
| 2005/0026359 | A1 * | 2/2005 | Voigt et al. | 438/243 |
| 2005/0167719 | A1 * | 8/2005 | Chen et al. | 257/301 |
| 2005/0167721 | A1 * | 8/2005 | Lin et al. | 257/302 |
| 2006/0292789 | A1 * | 12/2006 | Cheng et al. | 438/243 |

* cited by examiner

*Primary Examiner*—Michael Lebentritt
*Assistant Examiner*—Mohsen Ahmadi
(74) *Attorney, Agent, or Firm*—Birch, Stewart, Kolasch & Birch, LLP (57) ABSTRACT

A semiconductor memory device and fabrication method thereof. In a semiconductor memory device, each memory cell comprises a deep trench and a capacitor disposed on the lower portion thereof. A collar oxide layer having a first second sidewalls is disposed on the deep trench. The top of the first sidewall is at the same height as the surface of the semiconductor substrate. The top of the second sidewall is substantially equal to the top of the capacitor. The memory cell further comprises a buried conductor layer disposed on the second sidewall and the capacitor and a buried strap adjoining the buried conductive layer, and a transistor disposed on the surface of the semiconductor substrate and electrically connected to the capacitor through the buried strap and the buried conductive layer.

9 Claims, 8 Drawing Sheets

SEMICONDUCTOR MEMORY DEVICE AND FABRICATION THEREOF

BACKGROUND

The invention relates to a semiconductor device and fabrication thereof, and in particular to a memory device circuit, structure and fabrication thereof.

Dynamic random access memory (DRAM) is a semiconductor device popular for various electronic applications. Typically, a DRAM unit comprises a transistor and a capacitor, in which source electrode of the transistor is connected to a bit line, and gate electrode is connected to a word line. An opposed electrode of the capacitor is coupled to a voltage source, and a dielectric layer is interposed between a storage electrode and the opposed electrode. As known in the art, the transistor acts as a switch for controlling reading and writing data. Word 1 or 0 is presented according storage of electrons in the capacitor to store electronic information.

Figure 1:
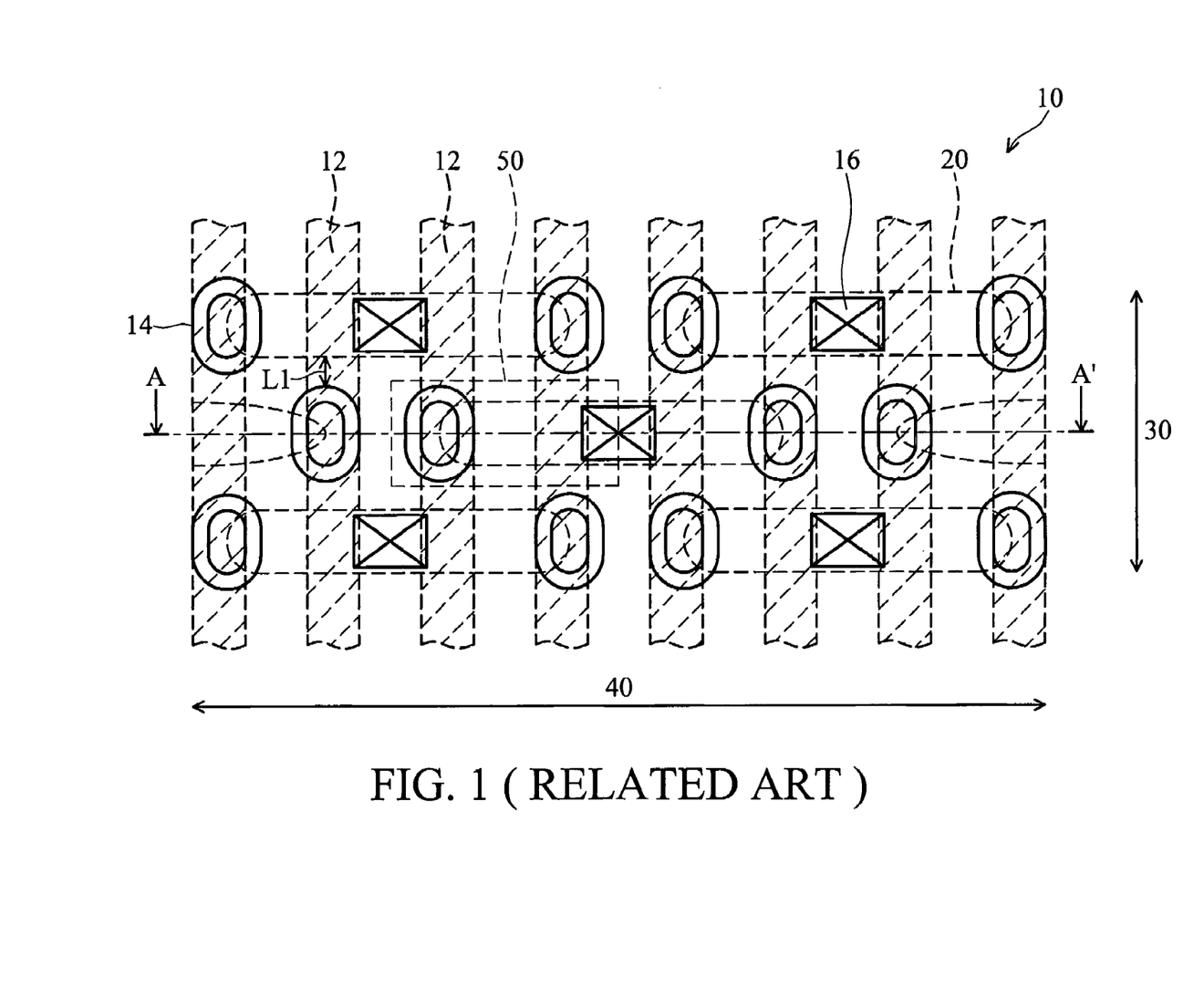
FIG. 1 is a top view of a conventional semiconductor device.
Figure 2:
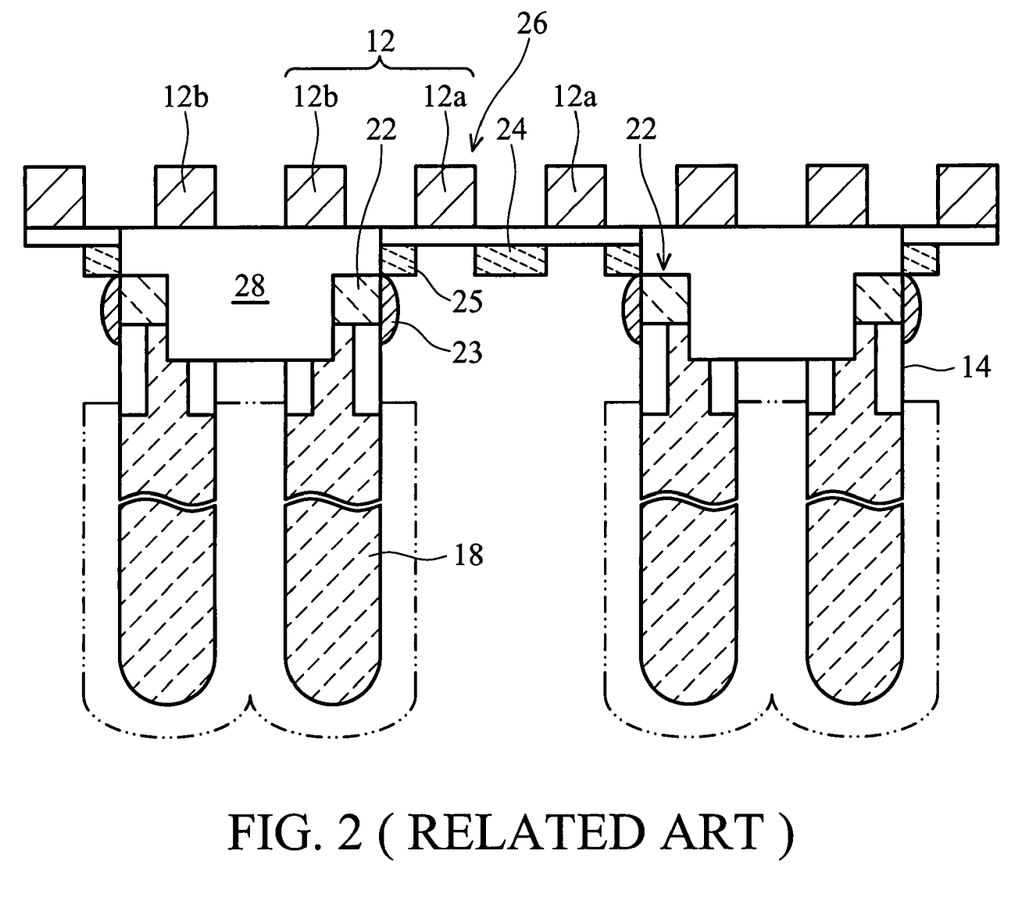
FIG. 2 is a cross-section along line A-A' of FIG. 1.

FIG. 1 is a top view of conventional semiconductor device 10. FIG. 2 is a cross-section along line A-A' of FIG. 1. Referring to FIG. 1 and FIG. 2, a semiconductor device 10 is disposed on a substrate, comprising a plurality of word lines 12 along a first direction 30, and a plurality of bit lines (not shown) along a second direction 40. As mentioned above, word lines 12 can act as a gate, and a doped region in an active area 20 can act as a source 24 and a drain 25, in which a MOS transistor comprises the source 24, drain 25 and gate.

In addition, a plurality of deep trenches (DT) 14 is disposed in the semiconductor substrate, comprising a capacitor 18 at the bottom thereof. The deep trenches 14 further comprise buried straps 23 on the one side of the sidewalls and adjacent to the buried conductive layers 22, and isolation structures 28 on another side to avoid shorts between the capacitor 18 and the word line 12b. Thus, the capacitors 18 can be coupled to the word lines 12b (MOS transistors) through the buried straps 23.

As shown in FIG. 1, the semiconductor memory device 10 comprises a plurality of memory units 50, each comprising a capacitor 18 at a lower portion of the deep trench 14 and a transistor 26 nearby. Two adjacent memory units 50 use two adjacent source electrodes 24. Thus, memory units 50 can be written to and erased when voltage is applied to the bit line and word line 12.

The distance between two adjacent memory units will be reduced with shrinkage of the semiconductor device, and device density will be increased at the same time. As shown in FIG. 1, in a conventional semiconductor memory device, the shortest distance L1 between two adjacent memory units 50 is a distance between the deep trench 14 and the active area 20 of the memory unit 50. In a semiconductor memory device 10, it is likely to induce device failure when L1 is too small. Consequently, a wide enough distance is required to avoid such device failure. To get a wide enough distance, the size of the deep trench 14 must be reduced to increase L1. Data storage time and process window, however, are affected when the memory 50 unit size is decreased.

SUMMARY

These and other problems are generally solved or circumvented, and technical advantages are generally achieved, by preferred illustrative embodiments of the present invention, which provide a semiconductor memory device and fabrication thereof.

An embodiment of the invention provides a method for forming a semiconductor memory device. A semiconductor substrate, comprising a plurality of deep trenches, is provided. Each trench comprises a first side, a second side opposite the first side and a third side between the first side and the second side, wherein the semiconductor substrate are defined to form a plurality of active areas, overlapping with a portion of the deep trench. A collar oxide layer is formed in each deep trench, comprising a first side portion, a second side portion and a third side portion, adjacent to the first, second and third sides of the deep trench respectively. A capacitor comprising a bottom electrode, a top electrode and a dielectric layer therebetween is formed at a lower portion of each trench, wherein the top of the top electrode is between top and bottom of the collar oxide layer. A portion of the second side portion of the collar oxide layer is removed, wherein subsequent to the removal step, the top of the second side portion is at substantially the same level as the top of the top electrode. A buried conductive layer is formed overlying the top electrode and the second side portion. A buried strap is formed in a portion of the semiconductor substrate adjacent to the second side of the deep trench, wherein the buried strap is adjacent to the buried conductive layer. A transistor is formed on a portion of the semiconductor substrate adjacent to the second side of the deep trench, wherein the transistor comprises a source, a drain and a gate, and the drain is electrically connected to the top electrode of the capacitor through the buried strap and the buried conductive layer.

Another embodiment of the invention provides a semiconductor memory device. A plurality of memory units are disposed overlying a semiconductor substrate, each comprising a deep trench, a capacitor, a collar oxide layer, a buried conductive layer, a MOS transistor and an isolation layer. The deep trench disposed overlying the semiconductor substrate, comprises a first side and a second side opposite the first side. The capacitor disposed in a lower portion of the deep trench comprises a bottom electrode, a top electrode and a dielectric layer threrebeteen. The collar oxide layer is disposed on sidewall of the deep trench, comprising a first side portion at the first side of the deep trench and a second side portion at the second side of the deep trench, wherein top of the first side portion is as substantially the same level as the semiconductor substrate surface, and top of the second side portion is as substantially the same level as the top electrode. The buried conductive layer is disposed overlying the top electrode and the second side portion of the collar oxide layer. The MOS transistor is disposed overlying an active area of the semiconductor substrate, wherein the active area is adjacent to the second side of the deep trench, the MOS transistor comprises a gate, a source and a drain, and the drain is electrically connected to the capacitor through the buried conductive layer. The isolation layer is interposed between two adjacent memory units and parallel with the active areas.

DESCRIPTION OF THE DRAWINGS

The invention can be more fully understood by reading the subsequent detailed description and examples with references made to the accompanying drawings, wherein:

FIG. 3~FIG. 13 illustrate a process for fabricating a semiconductor memory device 110 of an embodiment of the invention, wherein FIGS. 3, 9 and 13 are top views, FIG.

4~8 are cross sections along lines A-A' of FIG. 3, FIGS. 10~11 are cross sections along lines B-B' of FIG. 9, and FIG. 12 is cross section along lines A-A' of FIG. 9.

DETAILED DESCRIPTION

The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Figure 3:
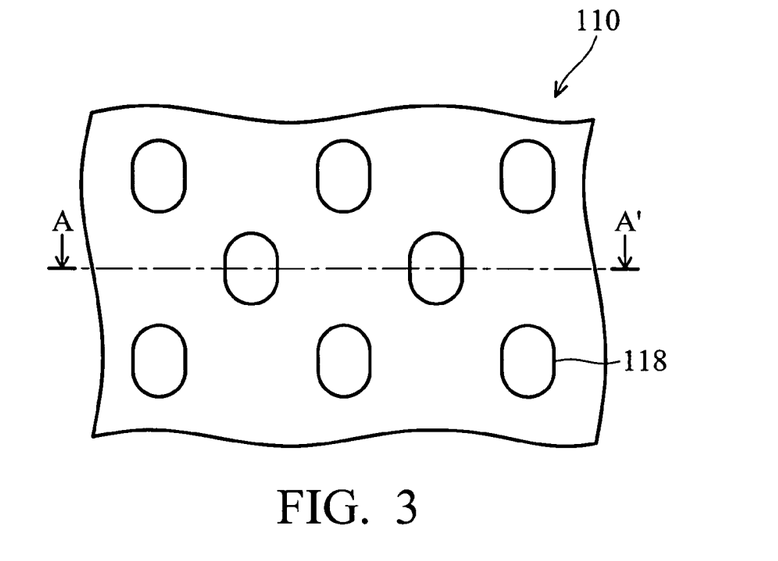
Figure 7:
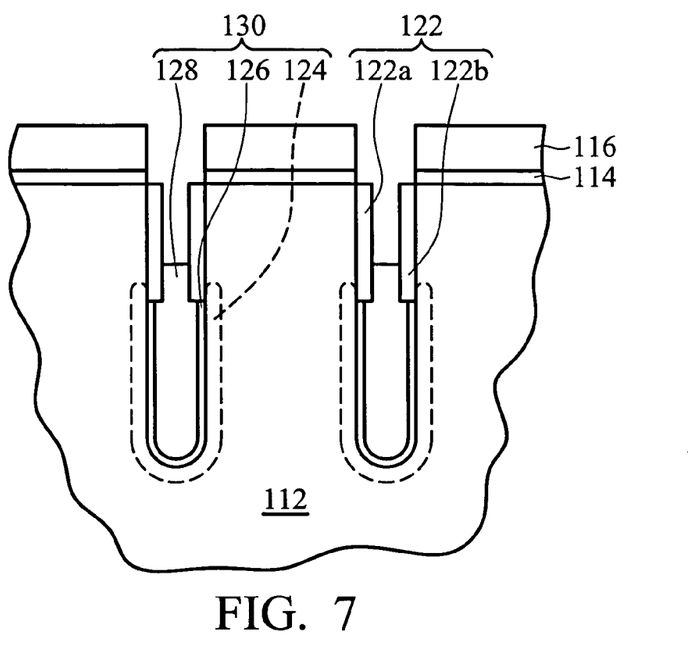
Figure 8:
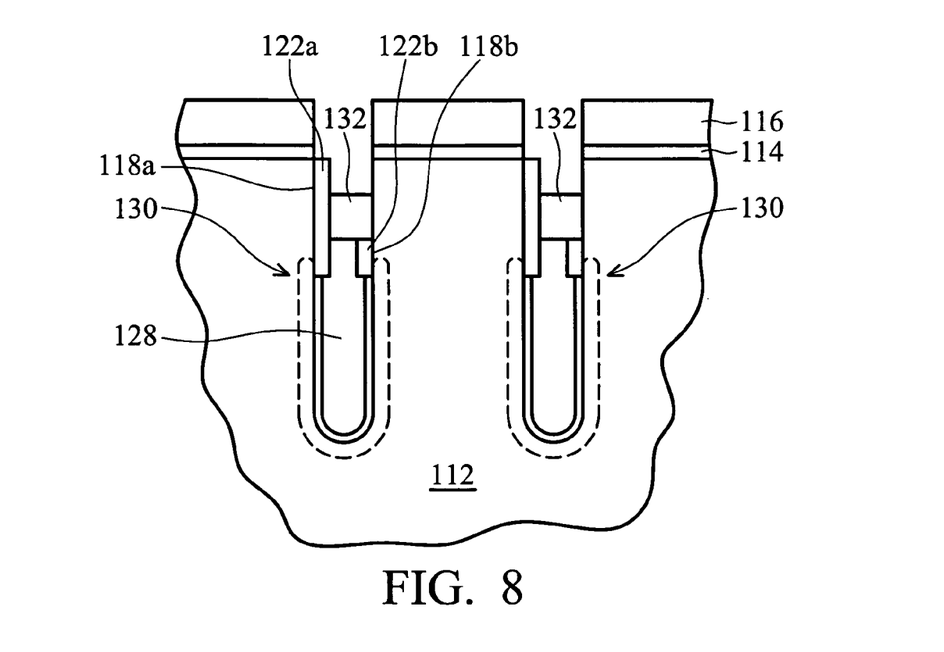
Figure 9:
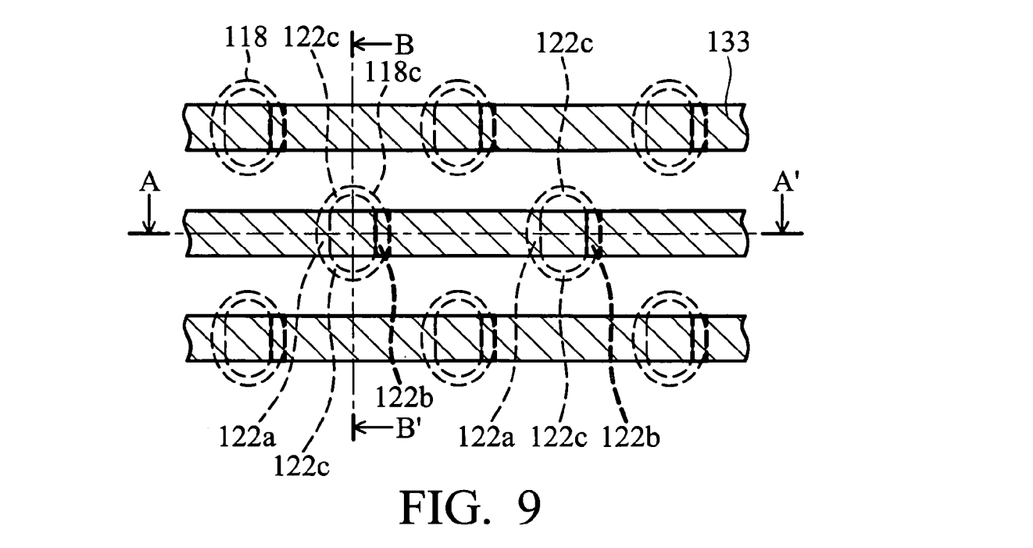
Figure 10:
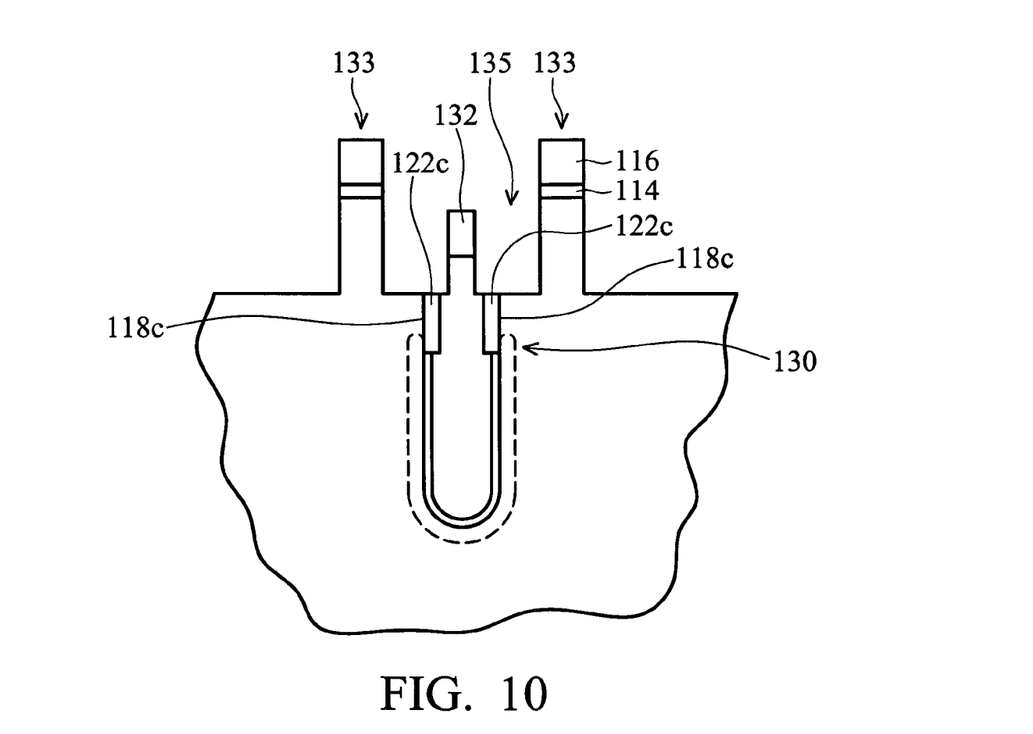
Figure 11:
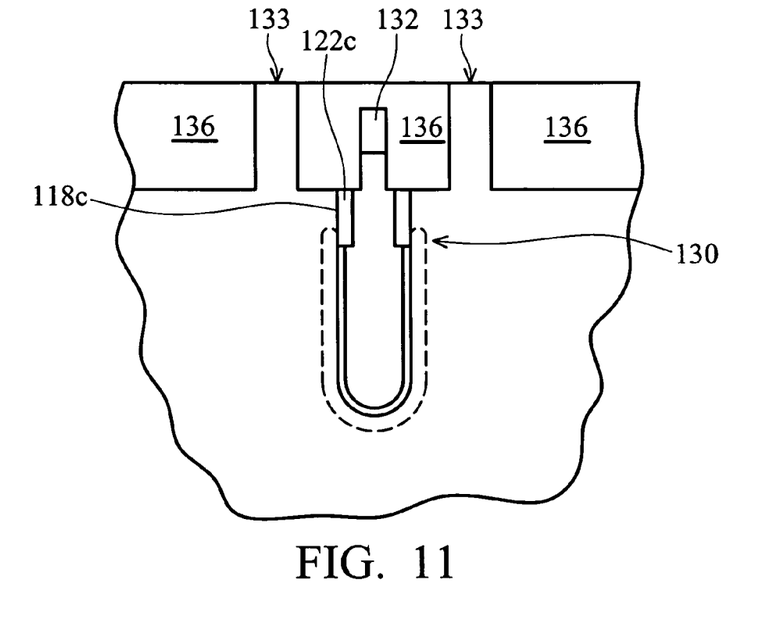
Figure 12:
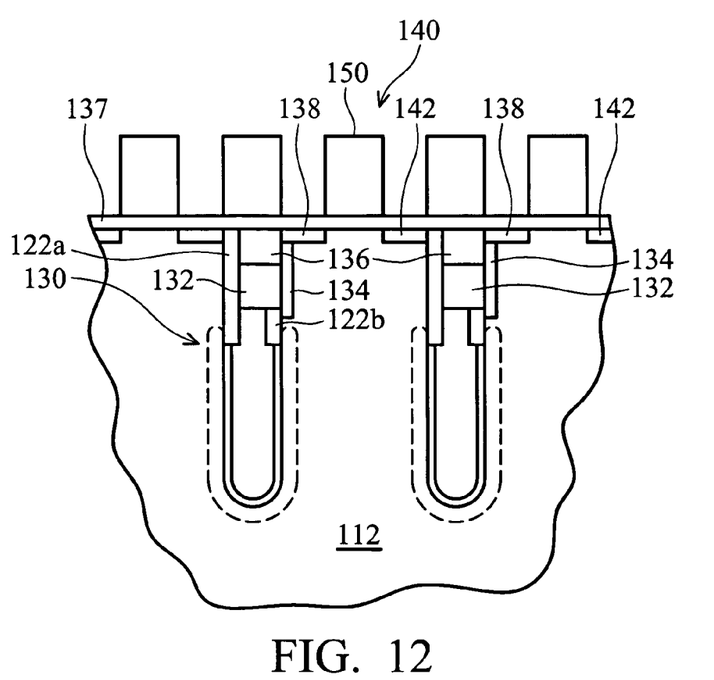
Figure 13:
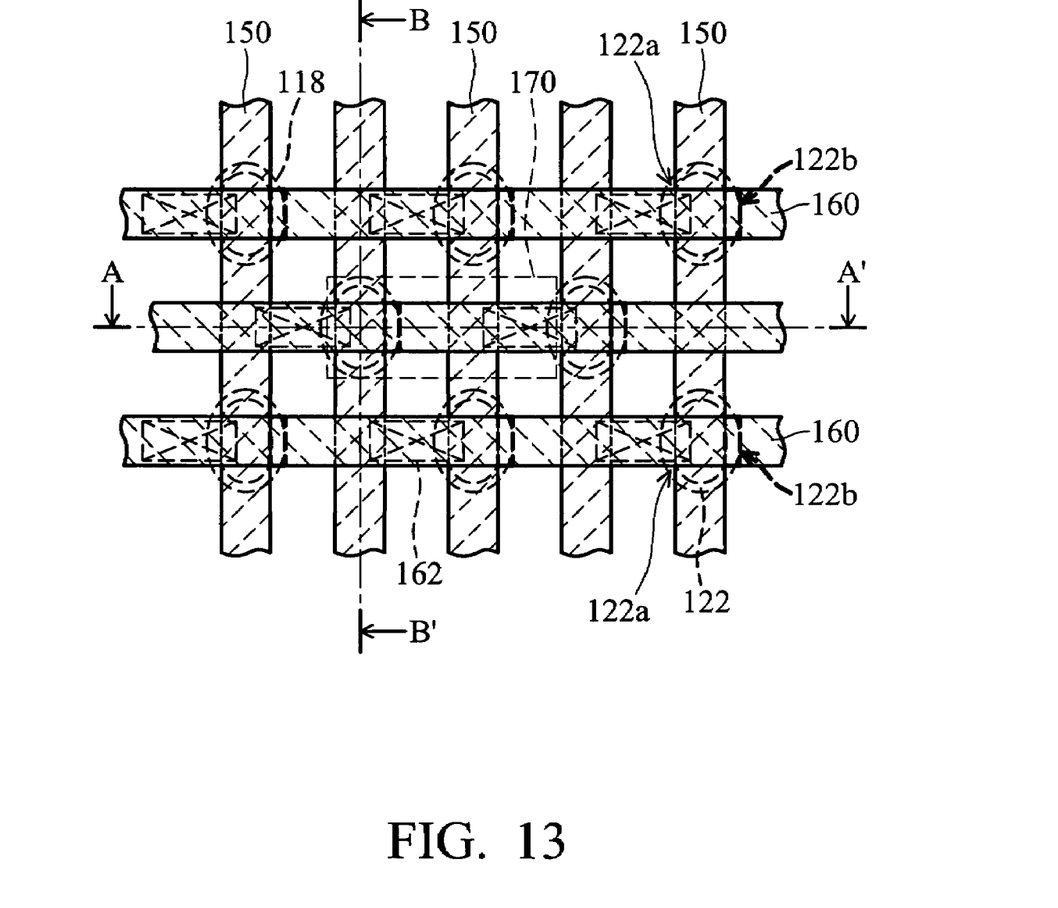

FIG. 3~FIG. 13 illustrate a process for fabricating a semiconductor memory device 110 of an embodiment of the invention, wherein FIGS. 3, 9 and 13 are top views, FIG. 4~8 are cross sections along lines A-A' of FIG. 3, FIGS. 10~11 are cross sections along lines B-B' of FIG. 9, and FIG. 12 is cross section along lines A-A' of FIG. 9.

Figure 4:
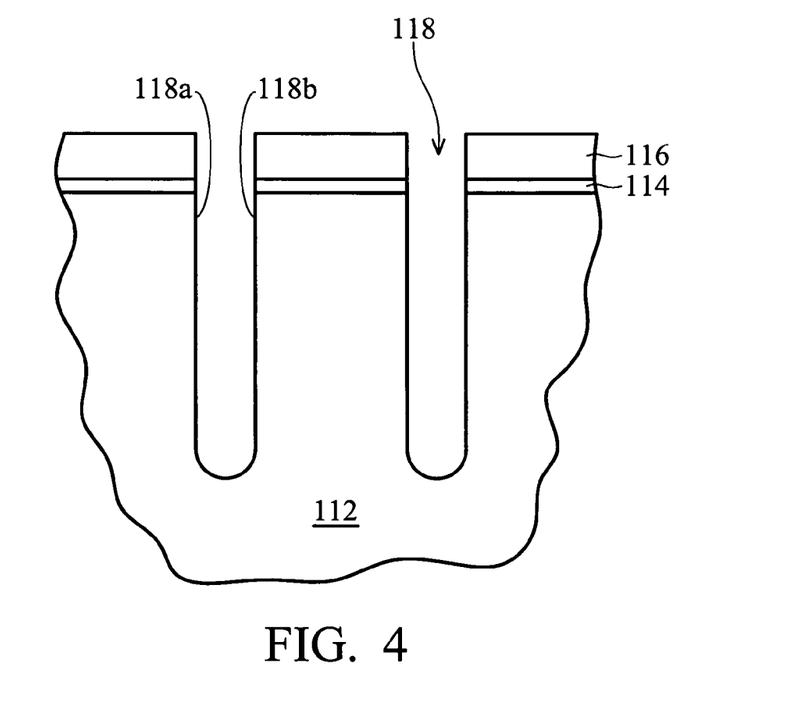

As shown in FIG. 3 and FIG. 4, a semiconductor substrate 112, for example a silicon substrate, is provided. A silicon oxide layer 114 and a silicon nitride layer 116 are formed on the semiconductor substrate 112 sequentially. The silicon oxide layer 114 and silicon nitride layer 116 are patterned using a photoresist layer (not shown) as a mask to form a plurality of openings therein. Thus, the patterned silicon oxide layer 114 and silicon nitride layer 116 act as a hard mask layer, and the photoresist layer is then removed. The substrate 112 is etched using the hard mask layer as a mask by isotropic etching to form a plurality of trenches 118, each comprising a first side 118a and an opposite second side 118b. In an example, the first side 118a is the left side of FIG. 4, and the second side 118b is the right side.

Figure 5:
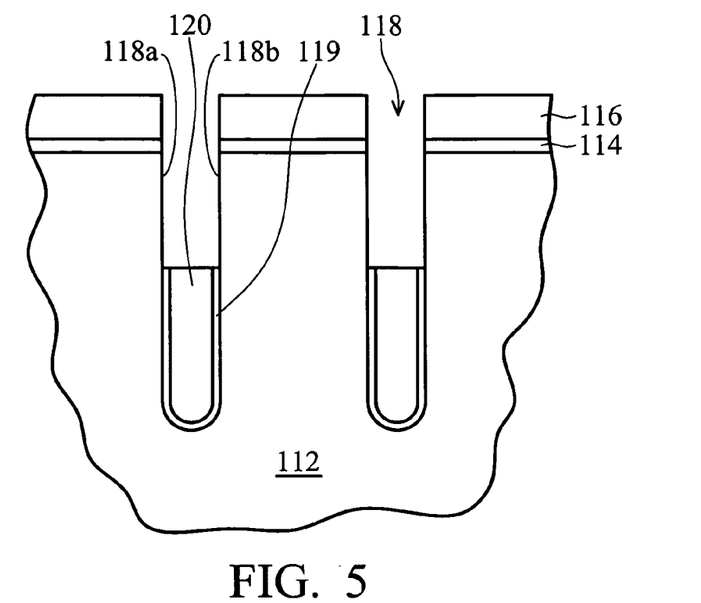

As shown in FIG. 5, a liner layer 119, for example a silicon nitride liner layer, is formed in surface of the deep trench 118. A sacrificial layer 120 is filled into the deep trench 118, and a wet etching is achieved to remove a portion of the liner layer 119 exceeding the sacrificial layer 120.

Figure 6:
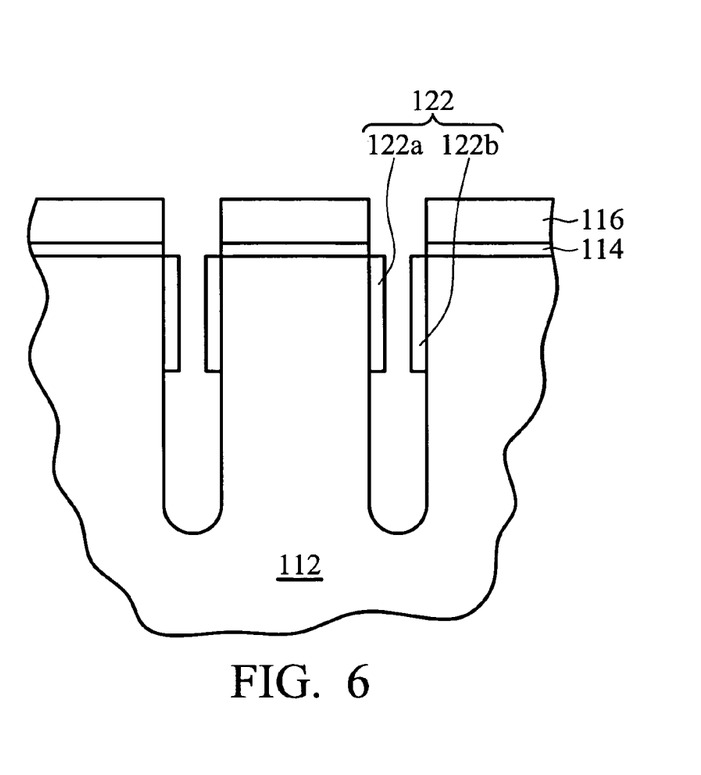

As shown in FIG. 6, subsequent to removal of the sacrificial layer 120, an oxidation process is achieved to form a collar oxide layer 122 on sidewall of the deep trench 118, overlying the liner layer 119. Next, the liner 119 is removed. The collar oxide layer 122 comprises a first side portion 122a and a second side portion 122b, adjacent to the first side 118a and the second side 118b of the deep trench 118 respectively.

As shown in FIG. 7, a bottom electrode 124, a dielectric layer 126 and a top electrode 128 are formed at a lower portion of the deep trench 118 to form a capacitor 130. In an exemplary embodiment of the invention, the top surface of the top electrode 128 exceeds the bottom of the collar oxide layer 122. In a further embodiment of the invention, the bottom electrode 124 is formed by doping n type or p type impurities into the semiconductor substrate 112 adjacent to lower portion of the deep trench 118, the dielectric layer 126 is a stack layer, such as a nitride-oxide layer (NO) or a nitride-oxide-nitride (ONO) layer, and the top electrode 128 comprises doped polysilicon.

As shown in FIG. 8, a patterned photoresist layer (not shown) is formed on the semiconductor substrate 112, covering the first side portion 122a and exposing the second side portion 122b. Next, the second side portion 122b uncovered by the photoresist layer is etched to remove a portion of the exposed second side portion 122b of the collar oxide layer 122. In a preferred embodiment of the invention, the top of the second side portion 122b is at substantially the same level as the top of the top electrode 128. The photoresist layer is then removed, and a buried conductive layer 132 is formed on the top electrode 128 and the second side portion 122b of the collar oxide layer 122, such as a doped poly silicon layer.

As shown in FIG. 9, the semiconductor substrate 112 is patterned by conventional photolithography and etching using a patterned photoresist (not shown) as a mask to define an active area 133, overlapping with a portion of the deep trenches 118.

As shown in FIG. 10 and FIG. 11, in which FIG. 10 and 11 are a cross section along line B-B' of FIG. 9, an etching process removes a portion of the semiconductor substrate 112 between two adjacent active areas 133 uncovered by the photoresist, and a third side portion 122c of the collar oxide layer 122. In FIG. 9, a third side portion 122c of the collar oxide layer 122 is a portion of the collar oxide layer 122 uncovered by the photoresist overlying the active area 133. Thus, openings 135 parallel to the active areas 133 are formed. Note that the cross section along A-A' line is not changed, but that along B-B' line is changed. As shown in FIG. 10, the third side portion 122c of the collar oxide layer 122 and top of the adjacent substrate is lower than top of the first side portion 122a of the collar oxide layer 122. An isolation layer 136, for example silicon oxide, is deposited blanketly on the semiconductor substrate 112 to fill the openings 135 between the active areas 133, and then polished by chemical mechanical polishing to remove a portion of the isolation layer 136 exceeding the semiconductor substrate 112 surface level. The silicon nitride layer 116 and the silicon oxide layer 114 are removed.

As shown in FIG. 12, the dopants in the buried conductive layer 132 is out diffused by thermal processes to form a doped region in a potion of the semiconductor substrate 112 adjacent to the buried conductive layer 132, acting as buried strap 134. A gate oxide layer 137 is formed on the semiconductor substrate 112, and a plurality of word lines 150, for example comprising doped polysilicon and metal silicide, are formed on the gate oxide layer 137. The word lines 150 pass through the deep trenches 118. Next, the semiconductor substrate is ion implanted to form doped regions 138 and 142 adjacent to opposite sides of the word lines 150 respectively, acting as drain and source regions. Thus, a transistor 140 comprises the gate (word line 150), source 142 and drain 138 is formed. The doped region 138 is connected to the buried strap 134. Thus, the doped region 138 is electrically connected to the top electrode 128 of the capacitor 130 through the buried strap 134 and the buried conductive layer 132, and writing and reading of the capacitor 130 can be controlled by the transistor 140.

As shown in FIG. 13, a dielectric layer (not shown) is formed on the bit lines 150, and a plurality of bit lines 160 perpendicular to the word lines 150 are formed on the dielectric layer. The bit lines 160 are electrically connected to the doped regions 142, also referred to as source regions, through plugs 162 in the dielectric layer to form a plurality of memory units 170 on the semiconductor substrate 112.

In a semiconductor memory device 110, each memory unit 170 comprises a capacitor 130 at a lower portion of a deep trench 118 and a nearby transistor 140, in which both are electrically connected through a buried strap 134 and a buried conductive layer 132. In the process steps described, due to etching of only the second side portion 122b of the collar oxide layer 122, the buried conductive layer 132 can be electrically connected to the other area only through the opening overlying the second side portion 122a of the collar oxide layer 122. Other potential connections are protected by isolation structures, such as the isolation layer 136 and the first side portion 122a of the collar oxide layer 122. Consequently, the buried conductive layer 132 can electrically connect other areas only through the buried conductive layer 132 overlying the second side portion 122b, thus, shorts with other device, such as the transistor 140 or plug 162 of adjacent memory unit 170 do not occur.

In the semiconductor memory device 110 of the preferred embodiment of the invention, due to the change in layout, the distance between memory units 170 is changed. As shown in FIG. 11 and FIG. 13, due to the third side portion of the collar oxide layer and the isolation layer 136, the deep trench 118 is not electrically connected to active areas 133 of adjacent memory units 170. Accordingly, the distance of two adjacent memory units 170 is not limited to L1 of conventional memory device. In the circuit layout of the preferred embodiment of the invention, a deep trench 118 with larger size can be achieved to increase data storage time, improve reliability and reduce device failures.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor memory device, comprising:

providing a semiconductor substrate, comprising a plurality of deep trenches, each comprising a first side, a second side opposite the first side and a third side between the first side and the second side, wherein the semiconductor substrates are defined to form a plurality of active areas, overlapping with a portion of the deep trench;

forming a collar oxide layer in each deep trench, comprising a first side portion, a second side portion and a third side portion, adjacent to the first, second and third side of the deep trench respectively;

forming a capacitor at a lower portion of each trench, comprising a bottom electrode, a top electrode and a dielectric layer between the bottom electrode and the top electrode, wherein top of the top electrode is between the top and bottom of the collar oxide layer;

removing a portion of the second side portion of the collar oxide layer, wherein subsequent to the removing step, the top of the second side portion is at substantially the same level as top of the top electrode;

forming a buried conductive layer overlying the top electrode and the second side portion;

forming a buried strap in a portion of the semiconductor substrate adjacent to the second side of the deep trench, wherein the buried strap is adjacent to the buried conductive layer; and forming a transistor on a portion of the semiconductor substrate adjacent to the second side of the deep trench, wherein the transistor comprises a source, a drain and a gate, and the drain is electrically connected to the top electrode of the capacitor through the buried strap and the buried conductive layer.

2. The method for forming a semiconductor memory device as claimed in claim 1, further comprising, prior to the step of forming the transistors:

forming a patterned photoresist layer, covering the deep trenches and the active areas;

removing a portion of the semiconductor substrate and the third side portion by photolithography and etching to form an opening at the third side portion adjacent to the deep trench, wherein the opening is parallel to the active areas; and forming an isolation layer in the opening.

3. The method for forming a semiconductor memory device as claimed in claim 1, further comprising:

forming a dielectric layer on the semiconductor substrate;

forming a plurality of plugs in the dielectric layer, electrically connected to a transistor; and forming a plurality of parallel bit lines on the dielectric layer, electrically connecting to the plugs, wherein the bit lines are electrically connected to the transistors through the plugs.

4. The method for forming a semiconductor memory device as claimed in claim 1, wherein the step of forming the transistor comprises:

forming a plurality of word lines on the semiconductor substrate, passing through the active areas;

implanting each active area of the semiconductor substrate to form two doped regions adjacent to opposite sides of the word lines.

5. The method for forming a semiconductor memory device as claimed in claim 4, wherein the word lines are gates of the transistors.

6. The method for forming a semiconductor memory device as claimed in claim 4, wherein the two doped regions are the source and drain of one of the transistors respectively.

7. The method for forming a semiconductor memory device as claimed in claim 1, wherein the doped conductive layer is a doped polysilicon.

8. The method for forming a semiconductor memory device as claimed in claim 1, wherein the transistor is a MOSFET transistor.

9. The method for forming a semiconductor memory device as claimed in claim 1, wherein the buried strap comprises dopants, and the method for forming a semiconductor memory device further comprises a thermal process, annealing the buried conductive layer to out diffuse the dopants therein, forming a buried strap in a portion of the semiconductor substrate adjacent to one side of the buried conductive layer.

* * * * *